(12) United States Patent
Winkler

(10) Patent No.: US 7,692,165 B2
(45) Date of Patent: Apr. 6, 2010

(54) CHARGED PARTICLE BEAM DEVICE WITH A GAS FIELD ION SOURCE AND A GAS SUPPLY SYSTEM

(75) Inventor: Dieter Winkler, Munich (DE)

(73) Assignee: ICT, Integrated Circuit Testing Gesellschaft fur Halbleiterpruftechnik mbH, Heimstetten (DE)

(*) Notice: Subject to any disclaimer, the term of this patent is extended or adjusted under 35 U.S.C. 154(b) by 308 days.

(21) Appl. No.: 11/752,560

(22) Filed: May 23, 2007

(65) Prior Publication Data

US 2008/0067408 A1    Mar. 20, 2008

(30) Foreign Application Priority Data

May 23, 2006  (EP)  .................................. 06010677

(51) Int. Cl.
*G21K 5/10*   (2006.01)
*H01J 37/08*   (2006.01)

(52) U.S. Cl. ................... 250/492.21; 250/423 F; 250/396; 250/306; 250/288; 250/310; 250/492.2; 250/309; 250/307; 250/424; 250/426

(58) Field of Classification Search ............ 250/492.21, 250/423 F, 396, 306, 288, 310, 492.2, 309, 250/307, 424, 426

See application file for complete search history.

(56) References Cited

U.S. PATENT DOCUMENTS

| | | | |
|---|---|---|---|
| 3,852,592 A * | 12/1974 | Scoville et al. | 250/221 |
| 3,852,595 A * | 12/1974 | Aberth | 250/288 |
| 4,085,330 A * | 4/1978 | Wolfe | 250/492.2 |
| 4,318,028 A | 3/1982 | Perel et al. | |
| 4,638,209 A | 1/1987 | Asamaki et al. | |
| 5,139,624 A | 8/1992 | Searson et al. | |
| 2003/0234372 A1 * | 12/2003 | Park | 250/492.21 |

FOREIGN PATENT DOCUMENTS

| | | |
|---|---|---|
| EP | 1439564 A1 | 7/2004 |
| GB | 2127212 A | 4/1984 |

OTHER PUBLICATIONS

European Search Report dated Jan. 15, 2007.
Jeffrey M. Guevremont et al., "Design and characterization of collimated effusive gas beam sources: Effect of source dimensions and backing pressure on total flow and beam profile," Review of Scientific Instruments, Oct. 2000 vol. 71(10): pp. 3869-3881.

(Continued)

*Primary Examiner*—Jack I Berman
*Assistant Examiner*—Meenakshi S Sahu
(74) *Attorney, Agent, or Firm*—Patterson & Sheridan, LLP

(57) ABSTRACT

The present invention provides a charged particle beam device for irradiating a specimen with ions. The charged particle beam device comprises a gas field ion source unit for generating a beam of ions, the gas field ion source having an emitter unit having an emitter unit tip; and a gas supply system for directing gas to the emitter unit tip. The gas supply system comprises an array of capillary tubes. Further, the present invention provides a method for irradiating a specimen with ions by operating a charged particle beam device having a gas field ion source, wherein the method comprises the step of directing a gas flow to an emitter unit tip, wherein the gas flow has a gas beam aperture angle of 3° or less.

20 Claims, 11 Drawing Sheets

OTHER PUBLICATIONS

Hiroshi Hiroshima et al., "A Focused He+ Ion Beam with a High Angular Current Density," Jpn. J. Appl. Phys., vol. 31(12B): pp. 4492-4495.

V.E. Ptitsin et al., "A high power density submicron electron beam source," Ultramicroscopy, 2003 vol. 95: pp. 131-138.

W. Thompson et al., "The Gas Field Ion Source for Finely Focused Ion Beam Systems," Materials Research Society Symposium Proceedings, Nov.-Dec. 1995, David B. Poker et al., editors, Boston, Massachusetts vol. 396: pp. 687-693.

E. Salancon et al., "A new approach to gas field ion sources," Ultramicroscopy, 2003 vol. 95: pp. 183-188.

C B Lucas, "The production of intense atomic beams," Vacuum, 1973 vol. 23(11): pp. 395-402.

* cited by examiner

CHARGED PARTICLE BEAM DEVICE WITH A GAS FIELD ION SOURCE AND A GAS SUPPLY SYSTEM

CROSS-REFERENCE TO RELATED APPLICATION

This application claims priority to European Patent Application No. 06010677.0, filed May 23, 2006, which is herein incorporated by reference.

FIELD OF THE INVENTION

The invention relates to a charged particle beam device for irradiating, in particular inspecting or structuring a specimen by means of a beam of ions. In particular, the invention relates to a charged particle beam device having a gas field ion source and a gas supply system.

BACKGROUND OF THE INVENTION

Technologies such as microelectronics, micromechanics and biotechnology have created a high demand for structuring and probing specimens within the nanometer scale. On such a small scale, probing or structuring is often performed with charged particle beams which are generated and focused in charged particle beam devices. Examples of charged particle beam devices are ion microscopes as well as ion beam pattern generators. Charged particle beams, in particular ion beams, offer superior spatial resolution compared to photon beams, due to their short wave lengths at comparable particle energy.

Typically, a charged particle beam device for generating an ion beam comprises an ion point source and an optical column. Examples for ion point sources are liquid metal ion sources and gas field ion sources. In liquid metal ion sources, ion formation results from field desorption from a liquid protrusion stabilized by the electric field. Hereto in contrast, ion formation in a gas field ion source is based on ion formation at the very tip of an emitter unit in a gas ambient. The emitter tip is biased at e.g. 10 kV positive with respect to a downstream extraction aperture that produces an electric field strong enough to ionize the gas atoms in the vicinity of the emitter unit.

Gas field ion sources provide advantages over liquid metal ion sources including pumping out the gas after its neutralization, thereby preventing deposition, and decreasing the size of the ion beam by a very monochromatic ion beam. Further, in contrast with liquid metal ion sources, beams of light ions such as Helium ions or the like can be generated.

However, gas field ion sources also provide difficulties. One of the main difficulties is to get enough gas particles to the tip without increasing the pressure in the optical column because in this case the gas would downgrade the vacuum level in the high-vacuum optical column. This, in turn, would result in a higher rate of collisions of the beam ions with the residual gas, thus leading to blur in the irradiating application. For example, it is known in the state of the art to operate the emitter tip within a recipient with a high partial pressure of the utilized gas, and to apply a differential pumping system to isolate this recipient from the rest of the optical column. It is further known in the state of the art to use a nozzle that directs the gas flow to the emitter tip. This reduces the total gas load as only the area around the emitter tip is exposed to the required high gas pressure. For instance, in a geometry, where the nozzle with a 100 µm opening is at a distance of 10 mm from the tip, and where the minimum pressure required near the tip is about $10^{-4}$ mbar, the required gas flow dynamics results in an aperture angle of the gas beam of about 30° half width (cosine distribution) so that still a rather large total gas flow results. This will be explained in more detail with regard to FIGS. 1a and 1b below. In general, ion generating would capitalize from pressures of up to $10^{-2}$ mbar and more. However, if state of the art ion sources are operated at pressures of $10^{-3}$ mbar, $10^{-2}$ or higher pressures, the ion beam quality is substantially reduced due to the large number of gas particles contaminating the optical column. Examples for gas field ion sources as described in this paragraph are given in H. Horishima et al: "A focused He+ ion beam with a high angular current density," Jpn. J. Appl. Phys. Vol. 31 (1992), pp. 4492-4495; E. Salancon et al: "A new approach to gas field ion sources," Ultramicroscopy 95 (2003), pp. 183-188, and W. Thompson et al: "The gas field ion source for finely focused ion beam systems," Mat. Res. Soc. Symp. Proc. Vol. 396 (1996), pp. 687-693.

High gas load in the source leads to glow discharge. A further improvement known in the state of the art is to use one nozzle for the gas supply and a further nozzle to pump this gas. By applying this technique, the total gas load can be further minimized. An example of such an ion beam generating apparatus is given in U.S. Pat. No. 4,638,209.

However, the techniques known in the state of the art are still problematic in that too many residual gas particles get into the optical column and cause collisions with the beam ions. As this leads to blur, the quality of the irradiating application is jeopardized.

The documents EP 1 439 564 A1, J. Guevremont et al.: "Design and characterization of collimated effusive gas beam sources: Effect of source dimensions and backing pressure on total flow and beam profile," Rev. of Sc. Instrum. Vol. 71 (2000), and C. Lucas: "The production of intense atomic beams," Vacuum 23 (1972), deal with gas flows. However, none of them deals with the specific difficulties of liquid gas ion sources.

Accordingly, it is an object of the present invention to overcome at least part of the problems in the state of the art. It is particularly an object of the present invention to provide a charged particle beam apparatus having a gas field ion source and a method of operating thereof that minimizes the interactions of the ion beam with gas molecules.

SUMMARY OF THE INVENTION

The present invention provides an improved charged particle system. According to aspects of the present invention, a charged particle beam apparatus and a method of operating a charged particle beam device are provided. Further advantages, features, aspects and details of the invention are evident from the dependent claims, the description and the accompanying drawings.

According to one aspect of the present invention, a charged particle beam device for irradiating a specimen with ions is provided that comprises a gas field ion source unit for generating a beam of ions, the gas field ion source having an emitter unit having an emitter unit tip; an extractor unit for extracting ions from the emitter unit tip; and a gas supply system for directing gas to the emitter unit tip; wherein the gas supply system comprises an array of capillary tubes.

According to another aspect of the present invention, a method for irradiating a specimen with ions by operating a charged particle beam device having a gas field ion source is provided wherein the method comprises providing an emitter unit having an emitter unit tip; and directing a gas flow to the emitter unit tip; wherein the gas flow has a gas beam aperture angle of 3° or less.

In prior art designs, the ion beam has to travel through high gas concentrations over a considerably long path, because even if a gas flow limiting aperture is located closely below the emitter, the concentration of the gas along the beam path reduces only slowly. For a realistic set up with an aperture of about 1 mm, the gas concentration is reduced by a factor of 10 after a travelling distance along the beam path of about 2 mm. The present invention allows, inter alia, the beam path to travel in an ambient of considerably lower gas load in comparison to state of the art charged particle beam devices. This is due to the fact that the array of capillary tubes of the present invention allows the generation of a gas flow that does widen only non-essentially, or does not widen at all, or that can even be focused. The charged particle beam device according to the present invention allows the generation of ions at the same or an enhanced effectiveness in comparison to apparatus from the state of the art. In addition, the quality of the ion beam, which is directed to a specimen, is enhanced due to the lower number of interactions between the ions and the ambient gas. Typically, irradiating the specimen according to the present invention is undertaken for inspecting, imaging, or modifying the specimen. An ion beam of higher quality allows for the improvement of the inspecting, imaging, or modifying quality.

In some embodiments of the present invention, a gas beam aperture angle of 0°, −10° or even −15° can be reached. As stated before, gas pressures of $10^{-3}$ mbar, $10^{-2}$ mbar, or even higher are desirable near the emitter unit tip. However, state of the art gas field ion sources operated at this pressure suffer largely from the huge number of particles contaminating the optical column. This problem can be essentially reduced by operating a charged particle beam device according to the present invention because large beam aperture angles can be avoided, resulting in a smaller number of gas particles, which are emitted into the source chamber, per pressure required at the emitter unit tip. In some embodiments, the gas flow can even be focused to the emitter unit tip.

Typically, the emitter unit is in the form of a needle with the emitter unit tip being the needle tip. The charged particle beam device according to the present invention may comprise two or more arrays of capillary tubes.

Typically, the charged particle beam device comprises an extractor unit for attracting and accelerating the ions from the emitter unit tip. It is possible, that the charged particle beam device comprises a further cathode for accelerating the ions. The further cathode is typically positioned downstream, i.e. below, of the extractor. The array of capillary tubes may additionally act as the extractor unit. The array of capillary tubes may be made of conductive material such as metal or may comprise conductive material such as coated glass.

The array of capillary tubes comprises a plurality of capillary tubes. Although the array of capillary tubes may comprise e.g. about 10, 50, or 100 capillary tubes, it is typical for the present invention that the array of capillary tubes comprises at least 1,000, 10,000, 50,000, 100,000 or even more capillary tubes. The term capillary tube refers to every gas flow guiding unit which is adapted for guiding the gas flow from the inlet of the capillary tube to its outlet. Typically, the inner cross section area of each tube of the plurality of tubes varies along the tube length by less than a factor of 64, 16, 4, or even by less than a factor of 2 compared to the inner cross section area at the outlet of the tube. In another preferred embodiment, the inner cross section area of each tube varies by less than 10%. The inner cross section area of the capillary tubes which—in case of capillary tubes having a circular cross section—is π times the inner radius square of the capillary tube cross section, is typically in the range of 1 $\mu m^2$-10 $\mu m^2$. In general, the inner cross section area of a capillary tube refers to the cross section of the tube through which the gas can flow. Typically, all capillary tubes have an identical inner cross section wherein small deviations are possible. For instance, according to one embodiment, the array of capillary tubes comprises 25,000 capillary tubes each having an inner diameter between 3 $\mu m^2$ and 5 $\mu m^2$. In typical embodiments of the present invention, the longitudinal tube axes of each tube of the array of capillary tubes are in straight lines which make it possible to "look through" the tubes.

Typically, the diameter of the capillary tubes varies by less than 5% along the tube length compared to the diameter at the outlet of the capillary tubes. In case of non-circular tubes the term "diameter of a capillary tube" is to be understood as the longest straight line that can be placed inside a tube in its cross-section plane. In some embodiments of the present invention, the inner cross section area of the capillary tubes at their inlets is larger than their inner cross section at their outlets, for instance by more than 15% or 20%.

Typically, the mean orientation of the capillary tubes is essentially perpendicular to the emitter unit orientation. Alternatively, the mean orientation of the capillary tubes is essentially in parallel to the emitter unit orientation. The term "essentially" indicates a +/−15% range of deviations. In general, however, the orientation of the capillary tubes and the emitter orientation may be at arbitrary angles such as 30°, 45°, 60°, or angles between 90° and 180° such as 135°. Typically, the emitter unit orientation coincides with the optical axis of the charged particle beam device. The emitter unit orientation typically runs along that dimension of the emitter unit in which the emitter unit's extension is the largest. In case of a needle as emitter unit, this is along the axis of the needle.

The pressure at the inlets of the tubes is called "dispensing pressure" since the dispensing pressure can be used to control the gas flow dispensed from the capillary tubes into the source chamber. Typically, the dispensing pressure is in the range of between 0.1 mbar and 10 mbar, wherein values in the range of 0.01 mbar-0.1 mbar are also possible. Typically, the array of capillary tubes is connected to a dispensing chamber. According to a typical embodiment, the inlets of the capillary tubes are exposed to a same dispensing pressure. Typically, the inlets of the capillary tubes of the array of capillary tubes are positioned within a common dispensing pressure chamber. This concept allows for an easy mounting of the array of capillary tubes to the gas supply system as well as for a simultaneous pressure application to all capillary tubes.

Typically, each capillary tube of the array has an inner cross section of smaller than 1,000 $\mu m^2$, 10 $\mu m^2$ or 1 $\mu m^2$. Typically, the length of each tube is larger than the square root of the inner cross section area of the tube by more than 5 times, 10 times, 50 times, or even by more than 100 times. For instance, according to one embodiment with the cross section of the tubes having circular shape, the length of each tube is larger than the diameter of the tube by more than 5 times, 10 times or 50 times.

Typically, the capillary tubes are oriented essentially in parallel to each other. In this event, the gas flow has typically a gas beam aperture angle at the outlet of the array of capillary tubes of about 3° or less. Typically, the tubes of the plurality of tubes are arranged as a bundle of tubes. A bundle of tubes refers to a plurality of tubes which are oriented essentially in parallel to each other (less than 10 degrees and typically less than 1 degree deviation) and where the tubes adjoin with one another to form a structure that is mechanically more rigid than individual tubes. Further, a bundle of tubes allows many tubes to be packed within a limited space. In another typical embodiment of the invention, the tubes are not parallel but inclined with respect to each other in order to focus the gas more precisely onto, e.g., the emitter unit tip. In this case, the gas flow has typically a gas beam aperture angle at the outlet of the array of capillary tubes of 0° or less. The array of capillary tubes may comprise a hole for housing the emitter unit. Typically, the hole is situated centrally within the array of capillary tubes. The position of the array of capillary tubes is typically such that the emitter unit tip is in the centre of, or close to the centre of the gas flow.

Typically, the distance between the outlets of each of the capillary tubes and the emitter unit tip is smaller than 50 mm, smaller than 10 mm, or smaller than 5 mm. Further, also typical, the square root of the inner cross section area of the capillary tubes at their outlet is about 5 times, 15 times or even 50 times smaller than the length of the capillary tubes.

In another embodiment of the present invention, the array of tubes may have a plate structure. An array of capillary tubes having plate structure is to be understood as a plurality of capillary tubes embedded in one common solid body. For instance, the capillary tubes can be provided in the form of channels in a solid body. The channels can be produced by a chemical process, such as etching, by a physical process, such as drilling, or by a combined chemical-physical process, such as chemical mechanical polishing. The solid body is typically made of silicon, silicon oxide, glass and the like.

In typical embodiments of the present invention, the gas supply system comprises a plurality of arrays of capillary tubes. Typically, the plurality of arrays of capillary tubes may be arranged in radial directions on a circular line coaxially surrounding the emitter unit. Alternatively, they can be arranged on a semi-circular line coaxially surrounding the emitter unit. The plurality of capillary plates can also be arranged such that the mean orientation of the capillary tubes is perpendicular to the emitter unit orientation.

Typically, the density of tube outlets on the outlet side of the tube plate is within the range of $10^3$ cm$^{-2}$ to $10^9$ cm$^{-2}$ and even more typical within $10^6$ cm$^{-2}$ to $10^{-8}$ cm$^2$. Typically, the gas flow is adjusted such that the density of the gas at the outlet of the capillary tubes is within the range of $10^2$ l/cm$^2$ to $10^7$ l/cm$^2$.

In typical embodiments of the present invention, at least one pump unit is arranged for drawing off the gas. Typically, the pump unit comprises a suction opening which is in some embodiments of the present invention situated opposite to the array of capillary tubes with respect to the emitter unit tip.

Typically, the gas used is a neutral gas. Once the gas is ionized, the ionized particles become separated from the neutral gas particles since the extractor unit attracts only the ionized gas particles. In this way, the neutral gas particles can be removed by a gas pump, which, in some embodiments of the present invention, can be applied in order to keep the vacuum level high, while the ionized gas particles are accelerated by the extractor unit. Typically, the gas is $N_2$, an inert gas like $H_2$, He, Ne, Ar, Kr or Xe, or $CH_4$ or a mixture of the above mentioned gases. The choice of gas depends on the ionization potential of the gas, chemical compatibility with the emitter unit and the charged particle beam device, the sample to be irradiated, and costs.

The array of capillary tubes serves to direct the gas particles with a high peaking-ratio. The higher the number of tubes, the higher the peaking ratio at a given total inner cross section of all tubes. A high peaking ratio in turn facilitates directing the gas with high precision towards the emitter unit, i.e. a high peaking ratio facilitates a high aiming accuracy. Here, the peaking ratio is defined as the ratio of a given forward direction intensity of a given gas flow at the outlet of the array of capillary tubes into a vacuum compared to the forward direction intensity of the same gas flow assuming an angular cosine distribution. An angular cosine distribution represents the distribution of a gas flow where the gas particles have a fully randomized motion at the outlet of the tube. A peaking ratio larger than 1 represents a gas flow where at the outlet the gas particles are directed within a smaller forward angle compared to the forward angle of a cosine distribution. Typically, peaking ratios in the range of 10-200 can be reached with charged particles beam devices according to the present invention. The peaking ratios of the state of the art are in the order of magnitude of 1. Therefore, a gas flow with a high peaking-ratio facilitates directing the gas with high spatial precision towards the emitter unit. The high peaking-ratio allows the total gas flow to be reduced in order to obtain the same gas concentration at a desired location, if the desired location is small compared to the extension of the gas flow beam. The reduced total gas flow in turn helps to maintain a better vacuum in the optical column.

BRIEF DESCRIPTION OF THE DRAWINGS

Some of the above indicated and other more detailed aspects of the invention will be described in the following description and partially illustrated with reference to the figures. Therein:

FIGS. 6b and 6c show further embodiments of a charged particle beam device according to the present invention having a gas ions source unit as shown in FIG. 6a;

DETAILED DESCRIPTION OF THE DRAWINGS

Within the following description of the drawings, the same reference numbers refer to the same components. Generally, only the differences with respect to the individual embodiments are described.

Figure 1A:
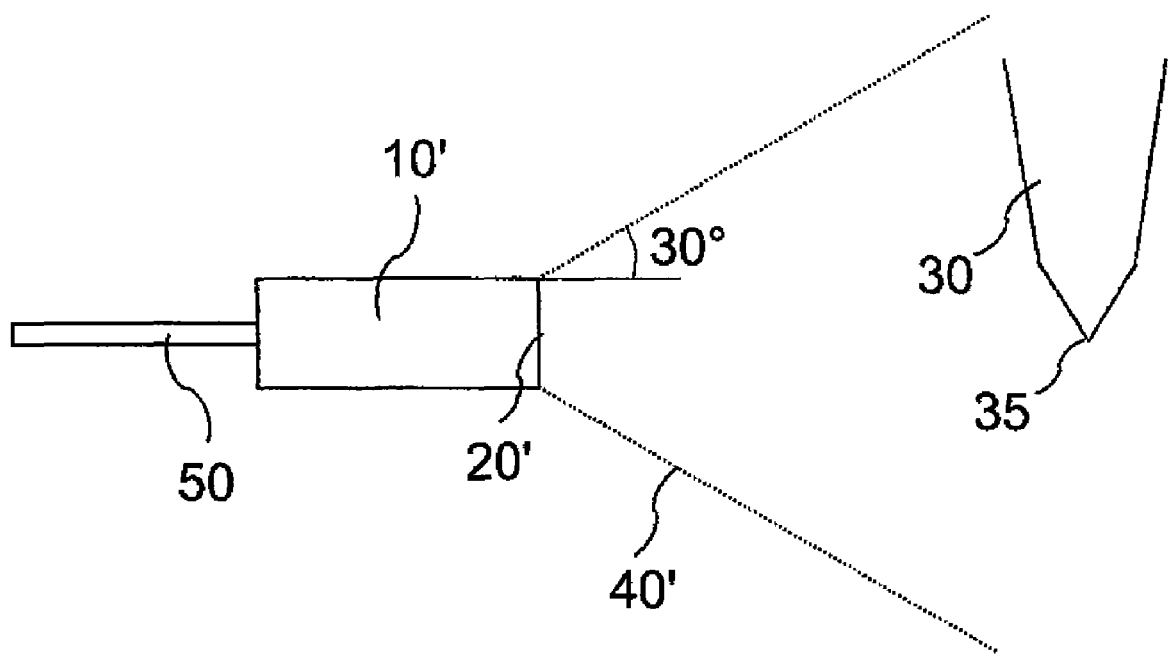
FIGS. 1a and 1b show an embodiment known in the prior art.
Figure 1B:
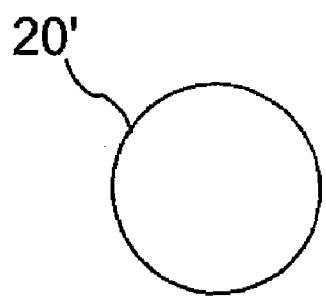

FIGS. 1a and 1b show an example of an embodiment known in the prior art wherein a nozzle 10' with a circular cross section at the outlet 20' as shown in FIG. 1b directs a gas flow to the emitter unit 30 with the emitter unit tip 35. The tube 10' has a gas supply 50. At the outlet 20' of the tube, the gas flow expands and broadens. The dotted lines 40' shall indicate the run of the gas flow. Typical values for the gas beam aperture angles in the state of the art are in the range of 30°. The distance between nozzle 10' and emitter unit 30 cannot be further reduced as otherwise arcing would occur. Hence, although the gas flow is only needed at the emitter unit tip for generating ions, a large part of the atmosphere surrounding the emitter unit is provided with the gas from the tube 10'. Typical diameters of the nozzle outlet 20' in the state of the art are in the order of magnitude of 100 µm and more.

Figure 2:
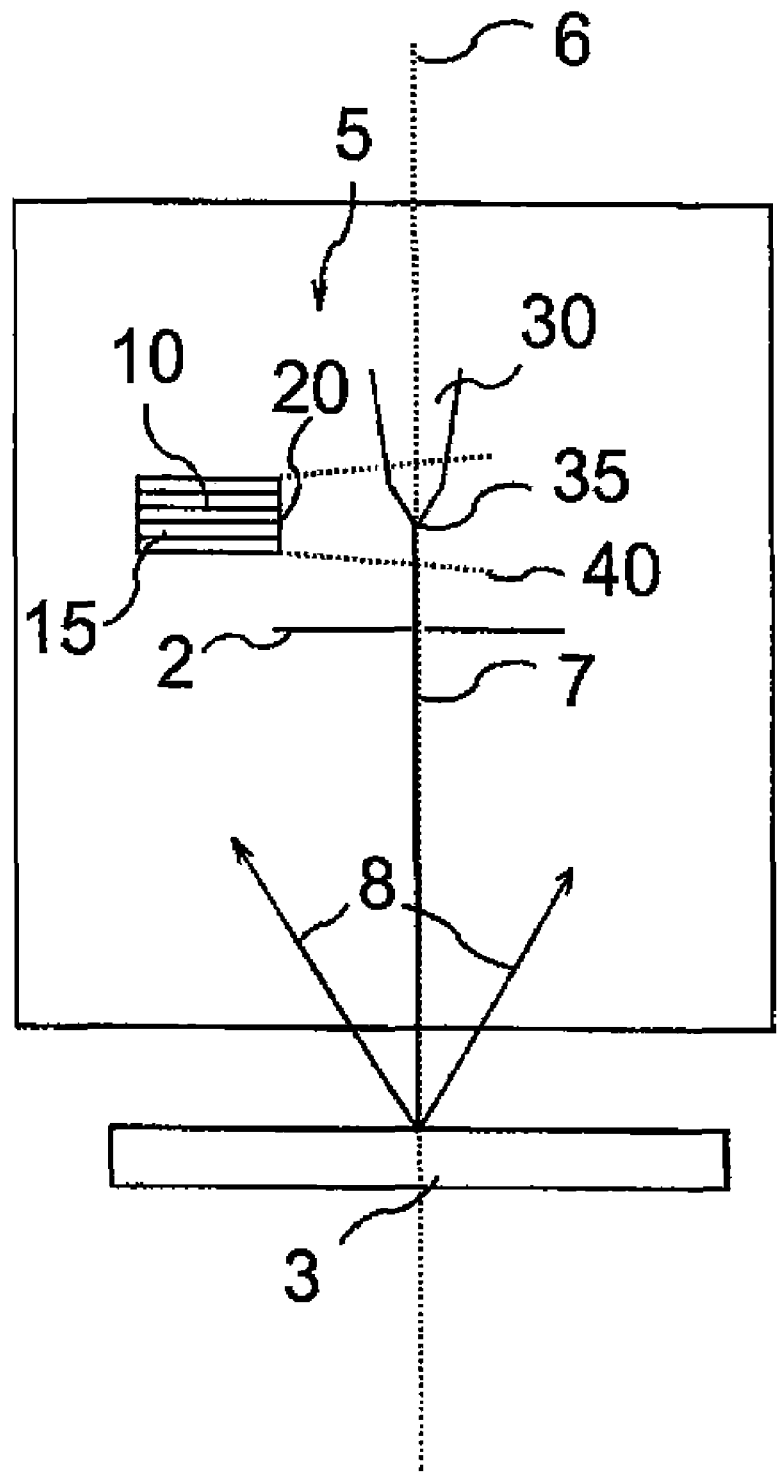
FIG. 2 shows an embodiment of a charged particle beam device according to the present invention.

FIG. 2 shows an embodiment of a charged particle beam device according to the present invention. The charged particle beam device 1 comprises a gas field ion source 5 with an emitter unit 30 that has a tip 35. The gas supply system for directing gas to the tip 35 comprises an array 10 of capillary tubes. An example for a means for supplying gas to the inlet of the array of capillary tubes will be given with regard to FIGS. 3a and 3b. For clarity's sake, the means for supplying gas to the inlet of the array of capillary tubes is omitted in all drawings apart from FIG. 3. In operation of the charged particle beam device, gas is led through the capillary tubes and directed to the emitter unit tip. Due to the array arrangement, the gas flow after the outlet 20 of the capillary tubes remains within the region which is indicated by dotted lines 40. That is, in contrast with the state of the art embodiments, the gas flow is widened at a negligible rate resulting in a higher gas rate at the emitter unit tip 35 which, in turn, allows for the reduction of the total gas load.

An extractor unit 2 serves the extraction and the acceleration of the ions. Typically, the extractor unit may also serve as an aperture for separating the source from the rest of the optical column. In this embodiment, apart from the opening for the ion beam, the aperture seals the remaining optical column ambient from the source ambient that typically has a higher gas pressure than the remaining optical column ambient. The ions form an ion beam 7 that moves along the optical axis 6 of the charged particle beam device. For the purpose of inspection, the charged particle beam current is typically in the range between 1 pA and 100 nA, depending on the kind of specimen and the spatial resolution needed. Embodiments providing further optical devices will be shown in FIGS. 3a and 3b and explained later. The ions impinge on the specimen 3. Depending on the application, secondary particles 8 may be generated during the interaction of the ions with the specimen material. For instance, the secondary particles may be electrons. In an inspecting or imaging application, the secondary particles such as the electrons are detected, e.g. by using a detector such as a pin diode or the like. In general, the specimen can be any physical body that is meant to be inspected or structured with high spatial resolution. Typically, the spatial resolution is high enough to resolve structures in the sub-micron range. In particular, the specimen can be a semiconductor wafer, an integrated circuit device, a micromechanical device, a data storage device or biological tissue.

Figure 3A:
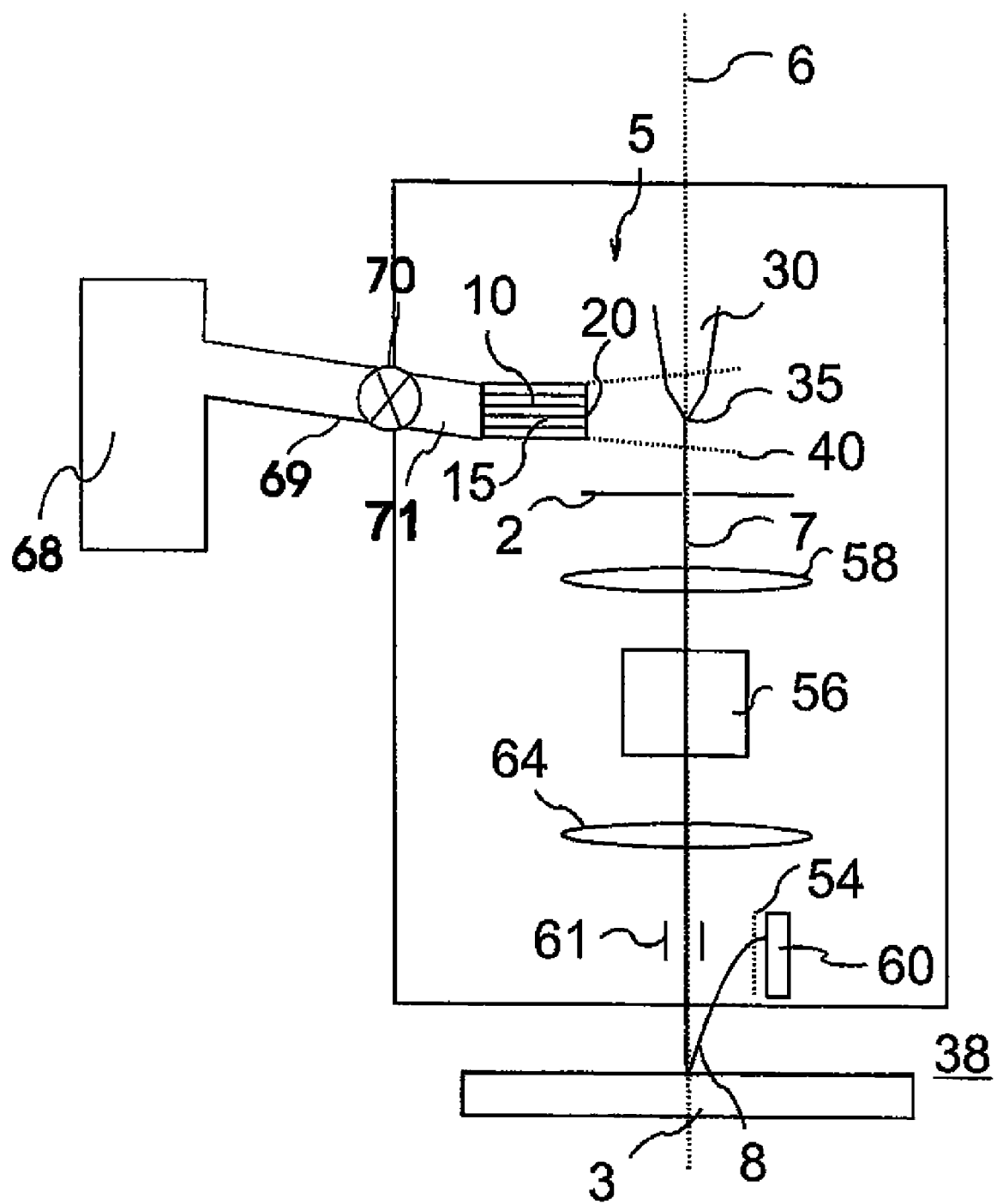
FIGS. 3a and 3b show further embodiments of a charged particle beam device according to the present invention.
Figure 3B:
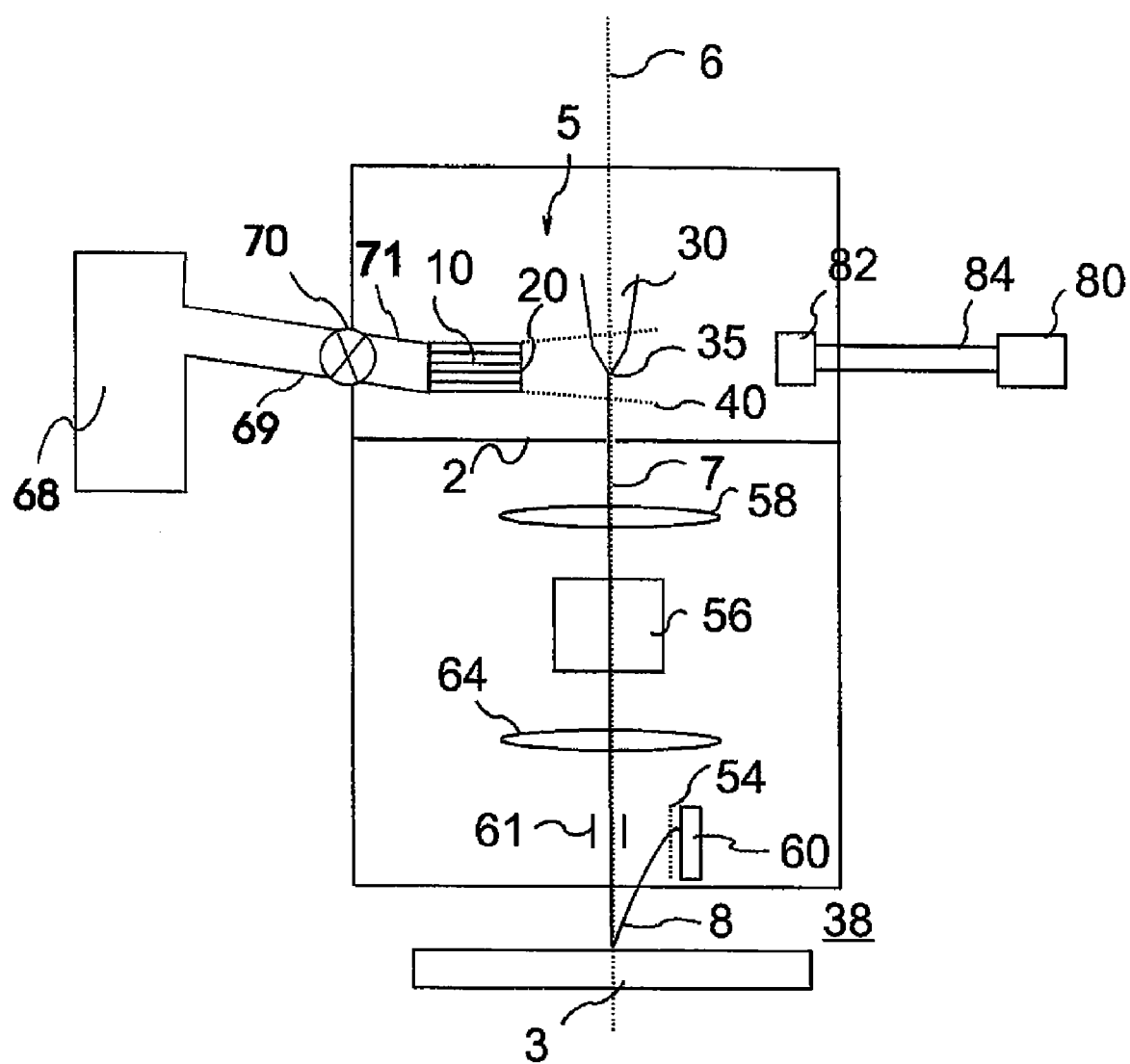

FIGS. 3a and 3b show further embodiments of charged particle beam devices according to the present invention. Further to the components already explained with regard to FIG. 2, the charged particle beam device comprises of a condenser lens 58 towards which the beam of charged particles 7 may be accelerated after having been extracted by extractor unit 2. That is, apart from the condensing effect, the lens 58 may also act as an acceleration unit. For instance, the ions at the extractor unit may have energy of about 6 keV and may be accelerated to 25 keV, 30 keV or even higher by the lens 58. The lens 58 may be an electrostatic, magnetic, or compound electrostatic magnetic lens. The beam 7 of ions may then pass a mass separator 56 in order to clean the beam from ions that differ in their weight. The mass separator can be omitted, in particular in those cases where the ion source is capable of providing an ion beam with a high purity. In FIGS. 3a and 3b, the lens 64 is shown that may be an electrostatic, magnetic, or compound electrostatic magnetic lens. In the drawings, lens 64 acts as a final focus lens. It is possible that the potential of final focus lens 64 is such that the ions are further accelerated between lens 58 and lens 64. For instance, energies of up to 150 keV can be generated. A deflector 61 is arranged between final focus lens 64 and specimen 3. In general, it is possible to arrange the deflector upstream, at the height of, or downstream of the final focus lens. The ions impinge on the specimen 3 and cause secondary charged particles 8 to leave the specimen. The secondary charged particles are detected at the detector 60 after they have been attracted by an electrostatic field generated by the grid 54. The position of the detector is typically at an angle of about 30° with regard to the optical axis 6. In applications such as implantation, it is not necessary to provide a detector.

The dispensing pressure chamber 71 is the chamber between the pressure control unit 70 and the inlets of the array 10 of capillary tubes. The inlet of the capillary tubes is the opening of the capillary tubes opposite to the outlet 20 of the tubes. In one embodiment, the gas volume of the dispensing pressure chamber is larger than the total volume of the array of capillary tubes by a factor of 10 in order to provide a constant dispensing pressure over all capillary tubes. Also, typically, the capillary tubes or a large part of the capillary tubes have essentially the same characteristic diameter D. "Essentially the same" is, in this context to be understood that the difference between the diameters of the single capillary tubes is within 15%. The control unit can be operated manually, e.g. by the operator of the charged particle beam device, or electronically, e.g. by an automatic controller. An electronically controlled pressure control unit would be able to open and close the connection between the gas supply unit and the dispensing pressure chamber at a high speed for pulsing the gas flow. In another embodiment of the present invention, the control unit is triggered by the loading process of the specimen. For instance, the gas flow can automatically be stopped during loading and unloading, and the gas flow can automatically be activated when irradiating of the specimen is started. Alternatively to the provision of a dispensing chamber, it is generally possible to provide a gas flow controller for controlling the gas flow through the array of capillary tubes.

FIG. 3a shows an embodiment that can be varied in many ways. For instance, it is possible to arrange one or more further lenses and/or one or more additional deflectors between specimen and source. The extractor unit may cover the full width of the optical column such as shown in FIG. 3b. The array of capillary tubes 10 may be connected directly to the gas supply without the arrangement of a dispensing chamber there between.

The embodiment of the charged particle beam device shown in FIGS. 3a and 3b may be applied for imaging and inspecting. Hence, the secondary charged particles 8 that are generated in the interaction of the ions impinging on the specimen 3 are detected at the detector unit 60. The detector may be a pin diode. Further, the detector may be segmented. The signals detected at the detector 60 serve to reconstruct images of the area of the specimen 3 that the ion beam has scanned.

The drawings of FIGS. 3a and 3b show some exemplarily components that may be implemented in a charged particle beam device according to the present invention. In general, and not limited to the embodiments shown, the beam of ions may be focused, condensed, collimated, aligned, filtered, de- and/or accelerated, deflected, stigmated etc. In order to do so, one or more of the group consisting of the following optical devices may be arranged on the beam path: Magnetic lenses, electrostatic lenses, compound magnetic-electrostatic lenses, Wien filters, condensers, aligners, collimators, deflectors, accelerators, decelerators, apertures etc. Generally, a de-accelerating electrode may be provided in the lower part of the optical column, such as adjacent to or within the objective lens. A de-accelerating electrode usually reduces the kinetic energy of electrons that are previously accelerated by the cathode and/or extractor unit.

The optical column 1 may provide for a high vacuum level. Typically, there are different levels of vacuum within the charged particle beam device. Differential pumping apertures may separate different parts of the optical column in order to have different levels. Further, differential pumping apertures may separate the optical column from the specimen chamber, i.e. the chamber into which the specimen is loaded. In FIGS. 3*a* and 3*b*, this vacuum chamber is indicated by reference number 38. Typically, the vacuum chamber together with the vacuum pumps (not shown) is able to provide a vacuum of better than $10^{-4}$ mbar and preferably less than $10^{-5}$ mbar in the region between the final focus lens and the specimen.

In the embodiments of FIGS. 3*a* and 3*b*, a gas pipe transports the gas from the gas supply unit 68 to the pressure control unit 70, which provides the desired dispensing pressure necessary to deliver the required total gas flow through the array 10 of capillary tubes. Later in this application, different kind of arrays of capillary tubes will be exemplarily described. The required total gas flow through the array 10 of tubes depends on many factors, e.g. the required beam current and/or the ionization probability of the gas. Generally, typical values of the pressure applied to the inlet of the array of capillary tubes are in between 0.1 mbar and 1 mbar. However, gas pressures such as 0.01 mbar or 0.05 mbar are also possible.

FIG. 3*b* shows the embodiment of FIG. 3*a* which has a pump unit for pumping away the gas emitted from the array 10 of capillary tubes. The pump unit typically comprises a pump 80 for providing a suction force. The pump may be controlled manually, e.g. by the operator of the charged particle beam device, or electronically, e.g. by a pump control unit (not shown). For instance, and not limited to the embodiment of FIGS. 3*a*, *b*, the pump control unit may be linked to the pressure control unit. In FIG. 3*b*, the pressure control unit is shown as reference number 70 and controls the gas flow through the array of capillary tubes. Hence, generally, the pumping force of the pump may be controlled in a correlative way to the pressure applied to the array of capillary tubes.

Further, in difference to the embodiment shown in FIG. 3*a*, the extractor 2 is shown in the form of an aperture expanding to the walls in order to form a separation between the chamber with the ion source, and the remaining parts of the optical column. The extractor can generally be in the form of an aperture. In general, further apertures can be installed along the optical beam in order to generate different vacuum levels.

Further, generally, a suction opening may be situated in the chamber of the gas field ion source. Typically, the suction opening may be arranged on the one side of the emitter unit tip whereas the array of capillary tubes is arranged on the other side of the emitter unit tip. An example of the arrangement of a suction opening is shown in FIG. 3*b* where number 82 refers to the suction opening. Further, a pipe, hose, tube, or the like, which is shown under reference number 84 in FIG. 3*b*, is provided for a connection between the suction opening inside of the optical column and the pump outside of the optical column. Not shown in FIG. 3*b*, additional apertures may be provided for further preventing the gas from entering the optical beam path 7 after the source unit. Generally, these apertures may be arranged before, at the height of, or after the extractor unit. It is also generally possible to arrange several apertures and pumping units between the source unit of the charged particle beam device and the specimen in order to provide different chambers having different vacuum levels. For instance, further or alternatively to the pumping unit close to the emitter unit, 2, 3, 4, or more pumping units and respective apertures could be provided. Each pumping unit could provide for a different vacuum level within the respective chambers defined by the apertures.

Typically, the apertures have only a small opening for the beam of ions. Typical opening sizes are 0.1-1 mm.

Figure 4A:
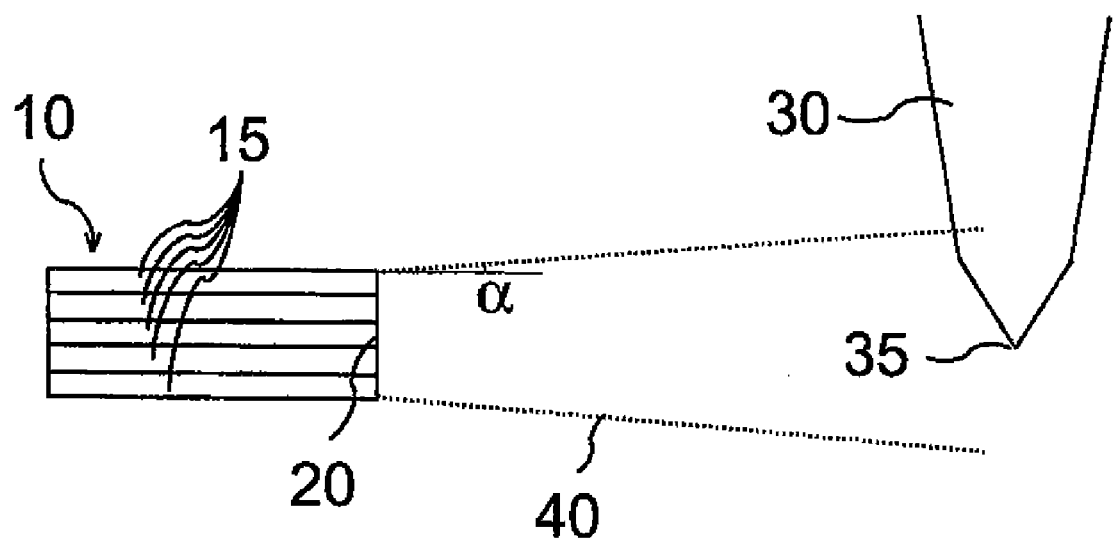
FIGS. 4a and 4b show an embodiment of the gas ion source unit according to the present invention.

FIG. 4*a* shows an embodiment of an excerpt of a charged particle beam device according to the present invention. The embodiment shown comprises the emitter unit 30 with the emitter unit tip 35. In general, and not limited to this embodiment, typical emitter unit materials used are refractory metals, such as tungsten, molybdenum, or tantalum, and niobium. Typically, the emitter unit diameter is in the range of 0.1 mm, whereas it is in the range of 10 nm at the emitter unit tip.

As previously explained, the gas supply system comprises an array 10 of capillary tubes. Further optional elements of the supply system such as a dispensing chamber, a pressure control unit and a gas supply unit may be applied in all embodiments of the present invention, but will, for clarity's sake, be omitted in the following drawings. The array 10 of capillary tubes comprises a plurality of capillary tubes 15. Typical numbers of capillary tubes are at least 1,000, 10,000, 100,000 or even more.

Figure 4B:
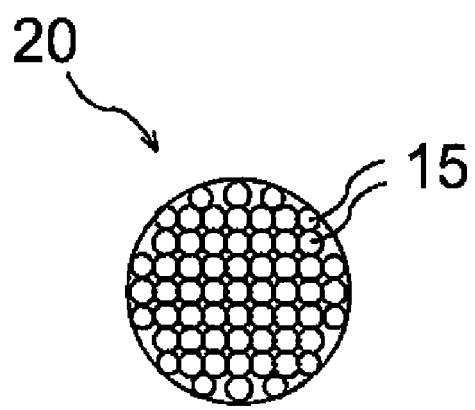
Figure 5A:
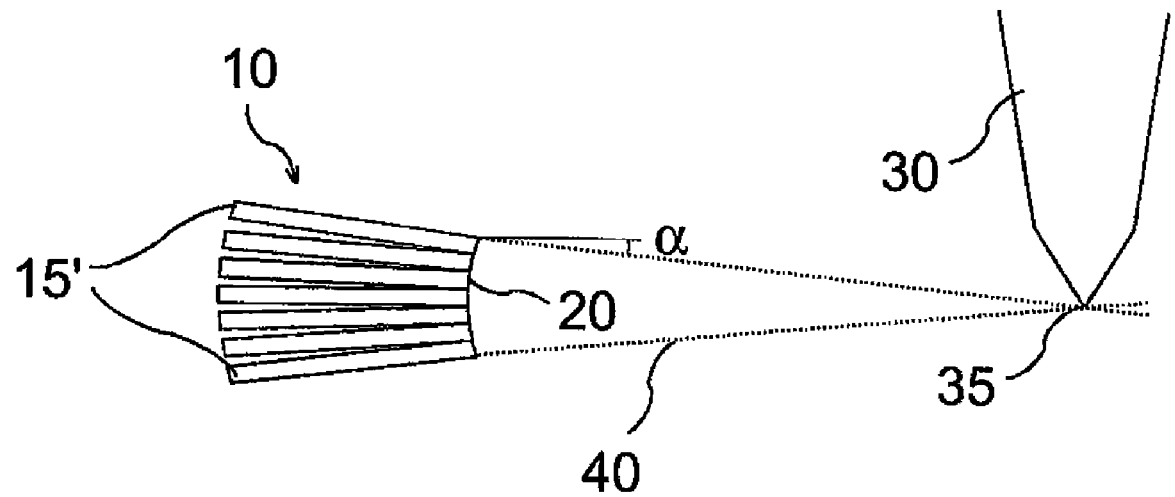
FIGS. 5a and 5b show another embodiment of the gas ion source unit according to the present invention.
Figure 5B:
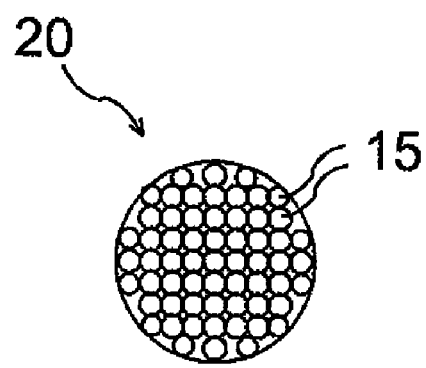

The typical cross section shape of the capillary tubes is circular. This is also shown in FIGS. 4*b* and 5*b* which show a cross sectional view on the array of capillary tubes at their outlet 20. However, the effects of the present invention can also be achieved by other shapes such as ellipsoid or rectangular cross sections. Further, the arrangement of the capillary tubes is typically such that the outlets of the capillary tubes are situated at regular intervals within the array. Certain applications, however, may capitalize on a non-regular arrangement.

The cross section of the array of capillary tubes is, in general, circular. This is exemplarily shown in FIGS. 4*b* and 5*b*. However, in several applications it is typical to have a rectangular, ellipsoid or hexagonal shape of the cross section of the array of capillary tubes.

In contrast with the tubes used in the prior art, the provision of an array of capillary tubes allows for a gas flow which has only a very small gas beam aperture angle $\alpha$. The gas beam aperture angle is defined as the angle of the gas flow at the outlet of the array of capillary tubes when compared to the mean orientation of the capillary tubes. The orientation of a capillary tube is defined as the orientation of the gas flow within the capillary tube. In other words, the orientation of a capillary tube typically coincides with its axis. The mean orientation of several capillary tubes is defined as the average orientation of the several capillary tubes. The mean orientation of all capillary tubes can easily be calculated by adding the orientations of all capillary tubes vectorially. In the event that the capillary tubes are inclined to each other, they are typically arranged symmetrically. In this event, it is typical that the mean orientation of the capillary tubes coincides with one or more capillary tubes situated in or close to the middle of the array of capillary tubes. In the event that the capillary tubes are essentially parallel to each other, the mean orientation of the capillary tubes coincides with the orientation of each of the capillary tubes. Experiences show that gas beam aperture angles of about 2.5° can be reached with the charged particle beam device described herein, for instance, with the embodiment of the charged particle beam device as described in FIGS. 2 and 3. This is a significant improvement in comparison to aperture angles in the prior art which are in the region of 30°. Hence, the charged particle beam device according to the present invention allows for exact directing of gas to the emitter unit tip. Gas flow broadening and gas diffusion are largely minimized.

In general, the inclination angle of the outermost capillary tubes is the angle between the outermost capillary tubes of the array. The outermost capillary tubes are the capillary tubes which are on the edge of the array of the capillary tubes. The choice of the adequate inclination angle depends on the specific application and the structure of the array of capillary tubes. Generally, the inclination angle between the outermost capillary tubes is between 0° and 30°, typically between 5° and 15°. However, higher values such as 35° or even 45° are also possible. In the case of symmetric arrays of capillary tubes, the inclination angle is identical in both dimensions of the cross section of the array of capillary tubes. In the event that a non-symmetrical arrangement of the capillary tubes within the array is preferred, the inclination angle in one dimension can differ from the inclination angle in the other dimension.

The inclination angle can be roughly estimated as two times the absolute value of the gas flow aperture angle $\alpha$. This becomes evident by looking at FIG. 5a where dotted lines 40 are depicted as prolongations of the outer walls of the outermost capillary tubes 15'. The inclination angle $\alpha$ of the capillary tubes is about $2\alpha$ in this 2-dimensional drawing. However, due to slight broadening effects, typically, the inclination angle is somewhat larger than two times the absolute value of the gas flow aperture angle.

FIG. 5b shows a cross section of the array 10 of capillary tubes 15 at their outlet 20. From this perspective, FIG. 5b does not differ from FIG. 4b as the inclination of the capillary tubes 15 cannot be recognized in the cross section view on the array 10 of capillary tubes 15. As previously mentioned, the shape, total number, the size and the material of the capillary tubes 15 and of the array 10 may differ dependent on the applications. Values as given before are applicable to all embodiments of the present invention.

Figure 6A:
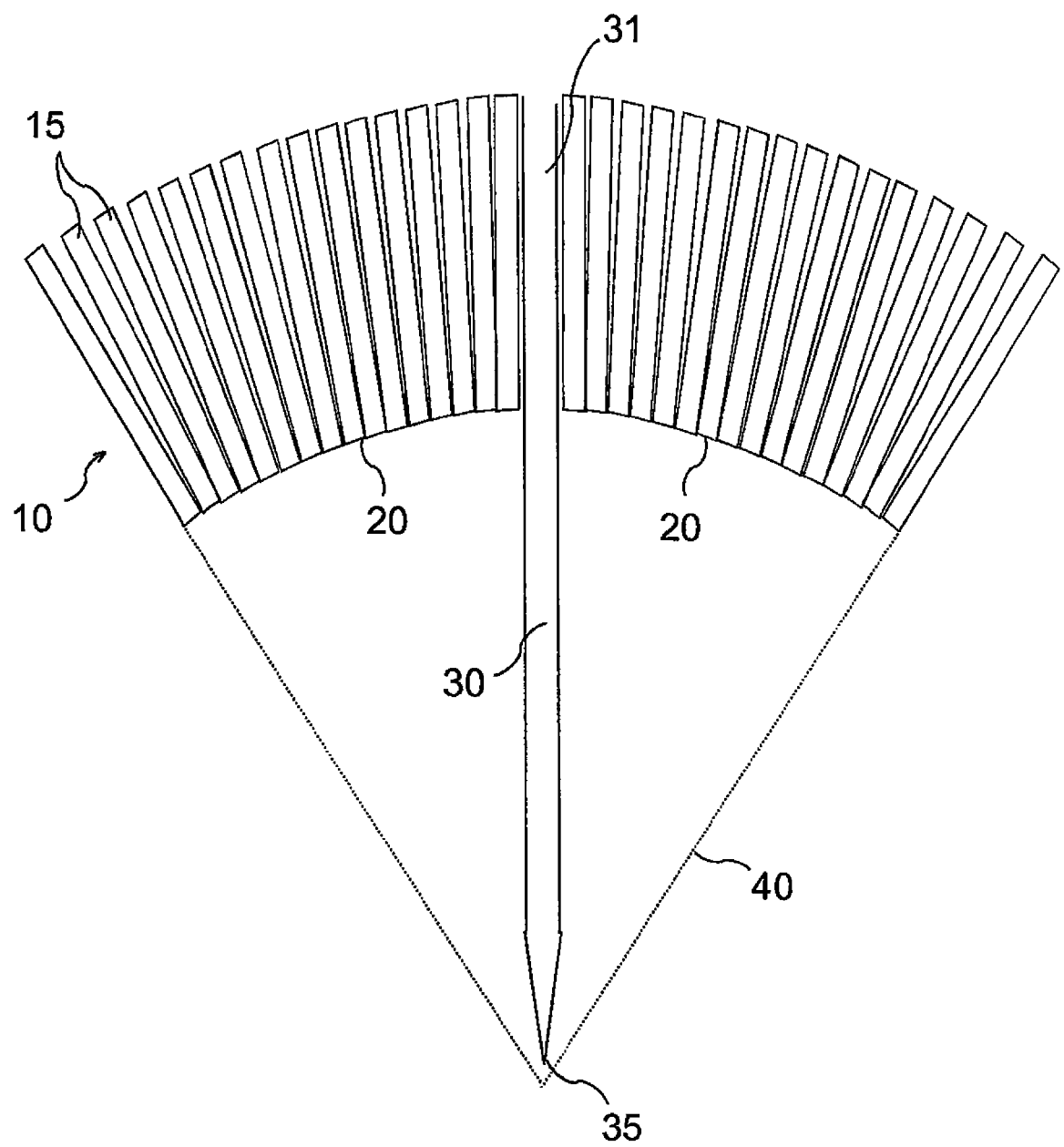
FIG. 6a shows another embodiment of the gas ion source unit according to the present invention.

FIG. 6a shows another embodiment of a gas field ion source unit according to the present invention. The emitter unit 30 with its emitter unit tip 35 is embedded in the array 10 of capillary tubes 15. For clarity's sake, the supply for supplying the array of capillary tubes with gas is omitted in this drawing. Typically, as also shown in the embodiment of FIG. 6a, the array of capillary tubes may generally be arranged such that the mean orientation of all capillary tubes is essentially in parallel with the emitter unit orientation. The emitter unit orientation is understood as the dimension in which the extension of the emitter unit is the longest, i.e. the orientation of the emitter unit is parallel with an imaginary connection line between emitter unit tip and emitter unit head. In many embodiments, the capillary tubes are inclined to each other, as it is shown in FIG. 6a. Thereby, the gas flow is focused. Typically, the arrangement of the capillary tubes is such that the focus of the gas flow lies close to the emitter unit tip such as directly at, or under the emitter unit tip. As shown in FIG. 6a, the capillary tubes may be arranged such that their outlet forms a section of a spherical surface. Typically, the orientation of the capillary tubes is such that the imaginary prolongations of the axes of the capillary tubes meet within a narrow region, typically in one focus. This focus may be situated at the emitter unit tip or below. For instance, in FIG. 6a it is shown directly under the emitter unit tip 35 where the dotted lines 40, which show the run of the gas flow, meet.

Figure 6B:
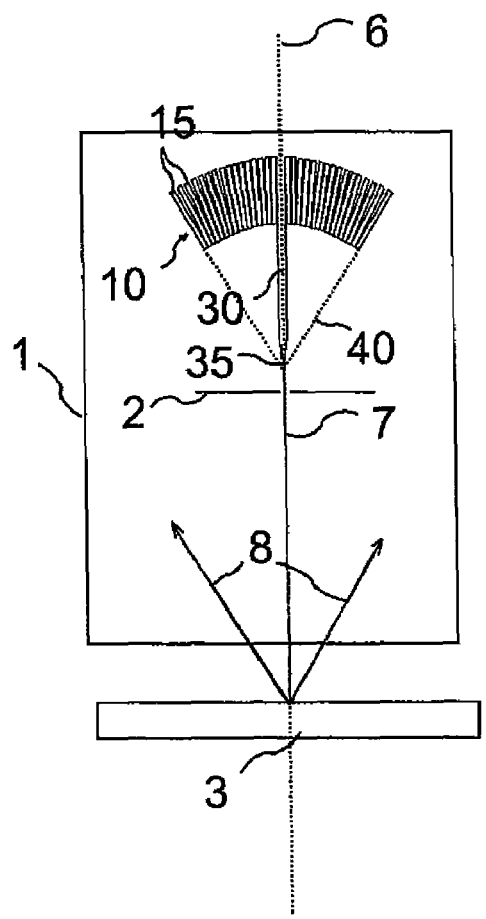

Generally, the array of capillary tubes may be integrally formed with the emitter unit, or the array and the emitter unit are separated parts. In this event, the array of capillary tubes may be provided with a hole or gap where the emitter unit or only a part of it, as shown exemplarily in the embodiment of FIG. 6b, is housed. Such a hole for housing the emitter unit is shown as reference number 31 in FIG. 6a. Typically, in the embodiments wherein the array of capillary tubes is oriented such that the mean orientation of all capillary tubes is essentially parallel to the emitter unit, such as in the embodiment of FIG. 6a, the array of capillary tubes is made of an insulating material, such as glass or the like.

Figure 6C:
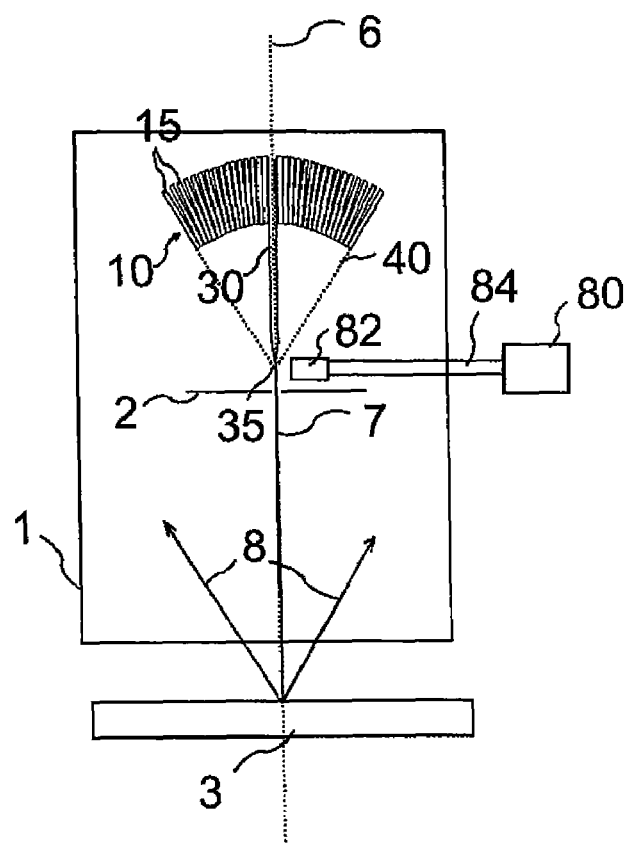

FIGS. 6b and 6c show a charged particle beam device having the gas field ion source as shown in FIG. 6a. As explained before with regard to FIG. 3a, depending on the application, one or more optical devices such as magnetic lenses, electrostatic lenses, compound magnetic-electrostatic lenses, Wien filters, condensers, aligners, collimators, deflectors, accelerators, decelerators, apertures etc. could additionally be arranged in the charged particle beam device.

FIG. 6c shows an embodiment wherein a pump unit having a pump 80, a suction opening 82, and a connection 84 between pump and suction opening is depicted for drawing off the gas emitted by the array 10 of the capillary tubes 15 after having passed the emitter unit tip 35. The suction opening may be arranged close to the emitter unit as long as no arcing occurs. Generally, it is also possible to have several suction openings with one common pump or, alternatively, several suction openings driven by several pumps. The suction openings may be arranged symmetrically to the emitter unit of the gas field ion source. For instance, another suction opening (not shown) could be arranged in FIG. 6c at the opposite side of the emitter unit tip 6, i.e., to the left of the emitter unit tip 35 in FIG. 6c. Alternatively, the suction opening could be ring-shaped and be positioned such that the hole of the ring coincides with the optical axis of the charged particle beam device.

Figure 7A:
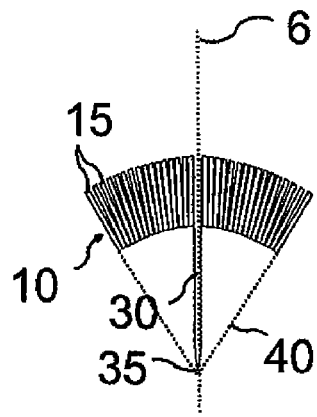
FIG. 7a-e show embodiments of the present invention of how the emitter unit and the array of capillary tubes can be orientated to each other.
Figure 7B:
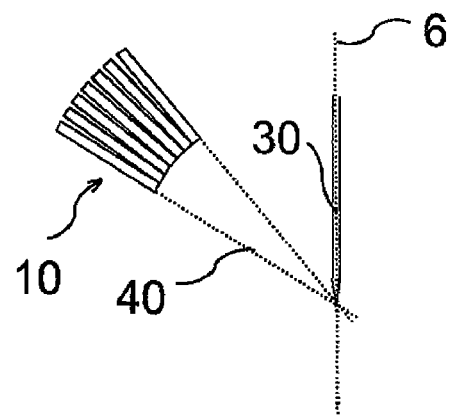
Figure 7C:
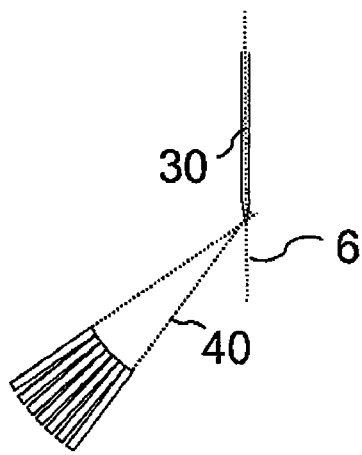
Figure 7D:
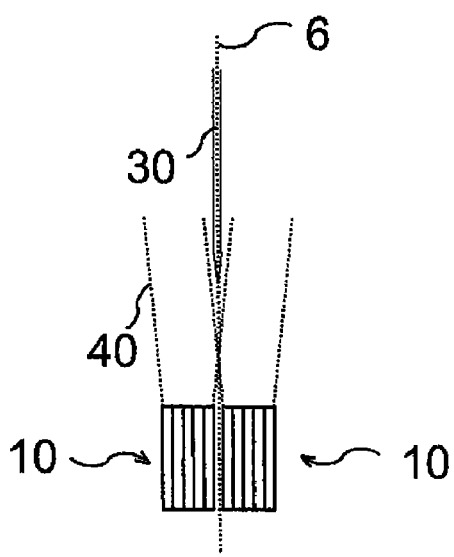

FIGS. 7a-e illustrate the arrangement of the array of capillary tubes with respect to the emitter unit. In general, the array may be arranged at arbitrary angles with respect to the emitter unit. Typically, the array of capillary tubes is arranged such that the emitter unit tip is in the centre, or even in the focus, of the gas flow. Typically, the orientation of the emitter unit coincides with the optical axis of the charged particle beam device. FIG. 7a shows the embodiment with the emitter unit orientation being essentially parallel to the orientation of the array of capillary tubes. In other words, the orientation of the array of capillary tubes is essentially parallel to the optical axis 6 of the charged particle beam device. The gas flow is focused on the emitter unit tip 35. FIG. 7b shows an embodiment wherein the array of capillary tubes is arranged above the emitter unit tip of the charged particle beam device. The gas flow is directed at an angle of about 45° to the emitter unit tip. FIGS. 7c and 7d show embodiments wherein the array of capillary tubes is situated below the emitter unit tip. In FIG. 7c, the angle between gas flow and the emitter unit orientation is about 135°. In FIG. 7d, there are two arrays of capillary tubes arranged which are situated below the emitter unit tip with the orientation of the array of capillary tubes being parallel to the emitter unit tip orientation and the optical axis of the charged particle beam device. In the embodiment shown in FIG. 7d, the ions are extracted from the emitter unit such that they pass between the two arrays 10 of capillary tubes. According to one embodiment of the present invention, the array of capillary tubes or the plurality of capillary tubes acts also as the extractor unit of the charged particle beam device. In this event, further to supplying a gas flow to the array of capillary tubes, a potential is impressed on the array of capillary tubes that allows extracting the ions from the emitter towards the array of capillary tubes. The array may be made of a conductive material. Typically, if the array of capillary tubes or a plurality of capillary tubes acts as the extraction unit, it is arranged between ion source and specimen on or close to the optical axis of the charged particle beam device, such as shown in FIG. 7d. These exemplary embodiments are not to be understood limited but intend to demonstrate that in general every combination of positioning and orientating the array of capillary tubes with respect to the emitter unit is possible.

Figure 7E:
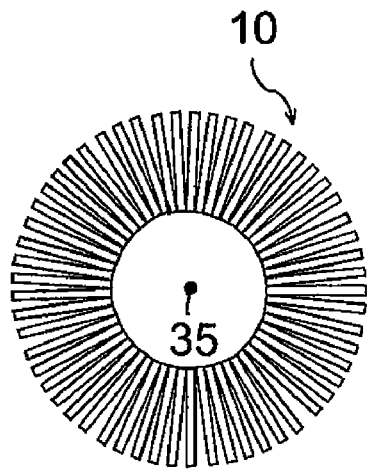

FIG. 7e shows another embodiment of an array 10 of capillary tubes and its positioning with respect to the emitter unit tip 35. As shown, the capillary tubes are positioned in a circular arrangement. In FIG. 7e, the capillary tubes cover a complete circle. In general it is also possible that the capillary tubes are arranged only along a pitch circle such as a semicircle or the like. Generally, the emitter unit, in particular the emitter unit tip, is positioned in the centre or close to the centre of the circle or pitch circle, which is defined by the arrangement of the capillary tubes.

Figure 8:
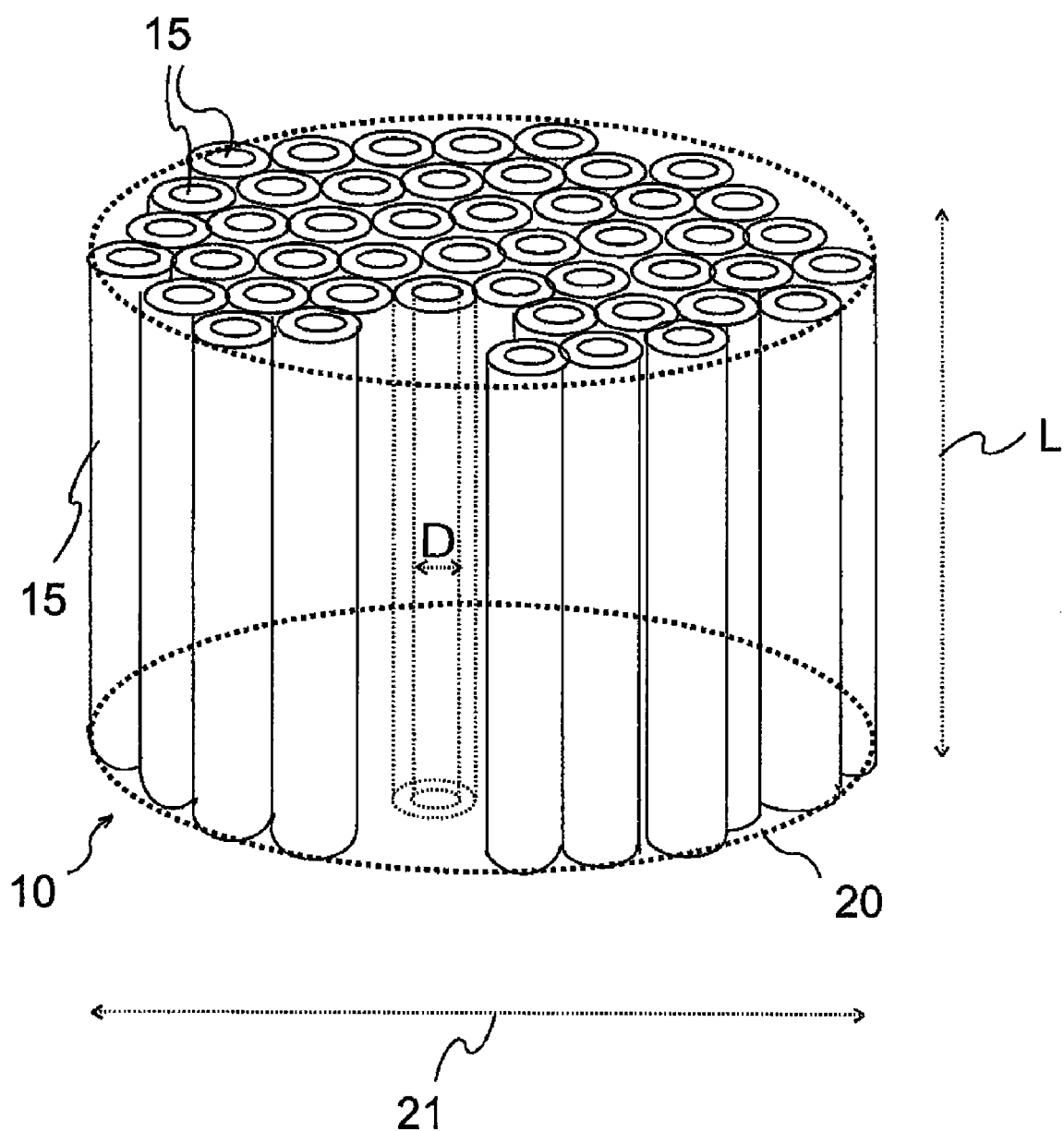
FIG. 8 shows an embodiment of an array of capillary tubes according to the present invention.

A three-dimensional illustration of an array 10 of capillary tubes 15, which may be used for embodiments of the present invention, is shown in FIG. 8. The array of capillary tubes has a circular shaped outlet and a circular shaped inlet. The diameter 21 of the outlet and inlet of the array of capillary tubes is, in this example, 1.5 mm. The length L of the capillary tubes is e.g. 4 mm. In general, and not limited to the present invention, the length of the tubes is at least 5 times as long as their diameter. Other relations between length and the diameter of the tubes, such as 20 times, 50 times, 100, or even 500 times are also typical. In the event that the tubes are non-circular, such as rectangular, the diameter shall be understood as being the square root of the cross section area of the capillary tube. Further, in order to achieve a low divergence of the beam, the tubes have to be sufficiently straight. Sufficiently straight refers to the requirement that the tubes have to be straight enough so that gas particles can pass through the tubes in a straight line without colliding with the tube wall.

The array, in this example, comprises 5,000 tubes with each capillary tube 15 having a diameter D of typically 15 μm. The diameter D of each tube is essentially equal in this example, that is, there may only be small differences up to maximally 10-20% of D. Further, the diameter D within each tube along its longitudinal orientation is essentially equal. Alternatively, and not limited to the embodiment shown, the capillary tubes could have a pointed shape, e.g. with a diameter of 2D at the inlet and a diameter of D at the outlet of the capillary tubes. In FIG. 8, the tubes 15 are essentially oriented in parallel with respect to each other. However, it is possible to align the capillary tubes at given inclination angles to better direct and focus the gas, as explained before with respect to FIGS. 5a and 6a-c.

The array of capillary tubes is typically tightly sealed and/or glued to this element of the gas supply system which the array is connected to. This can be, for instance, the dispensing pressure chamber (as explained before with regard to FIG. 3a), or a gas supply tube, hose, channel, pipe, or the like. The seal prevents gas from leaking. Typically, the array of capillary tubes is glued to the dispensing pressure chamber socket, the tube, hose, channel, or pipe at some distance away from the inlets or outlets of the array of capillary tubes in order to prevent the tube inlets or outlets from becoming clogged by the glue during gluing. The glue needs to be vacuum compatible.

Figure 9:
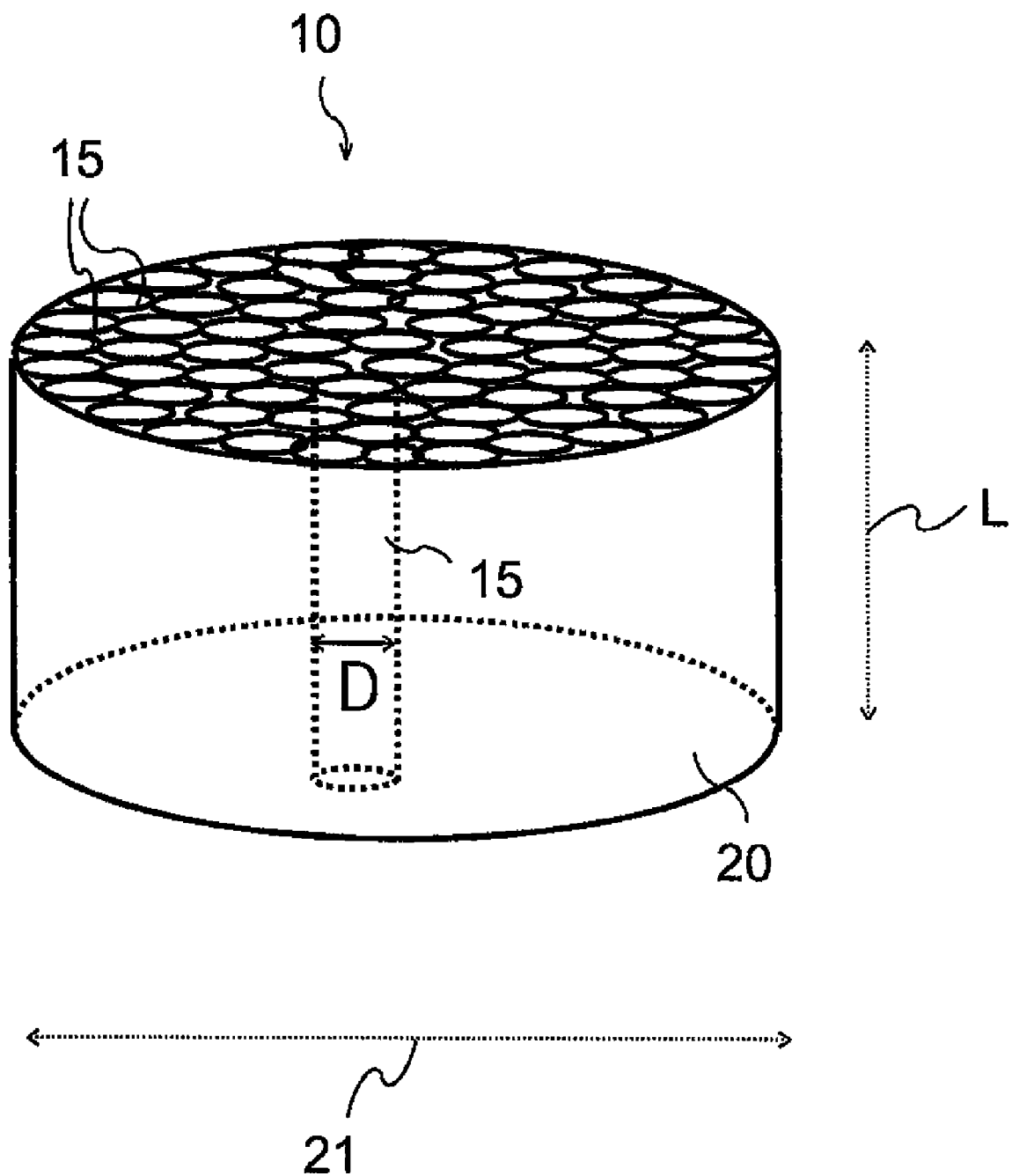
FIG. 9 shows a further embodiment of an array of capillary tubes according to the present invention.

A further three-dimensional illustration of an array 10 of capillary tubes 15, which may be used for the embodiments of the present invention, is shown in FIG. 9. In contrast with the array of capillary tubes described with regard to FIG. 8, the array has a plate structure. The shape of the array of capillary tubes may be circular, as shown in FIG. 9. However, other shapes, such as rectangular or ellipsoid, of the array may be employed without deriving from the spirit of the invention. Furthermore, the capillary tubes 15 are circularly shaped in the embodiment of FIG. 9. In general, and not limited to the embodiment wherein the array is provided by a plate structure, the capillary tubes may be arranged such that there is little distance between each tube and its neighboring tubes. Typically, the distance between the tubes is as little as technically possible. Also shown in FIG. 9, in general, it is possible that the capillary tubes are arranged with varying distances between them. For instance, dependent on the application, the distance between the outer capillary tubes may be larger than between the inner capillary tubes.

Capillary tubes are typically made of glass, glass ceramic, or silicon. In the event that the array is surrounding the emitter unit, it is typical that the material used is an insulator such as glass. In this event, the array of tubes typically provides a hole or the like where the emitter unit protrudes. Also, if the array of capillary tubes is arranged with its gas flow direction and the mean orientation of the tubes essentially perpendicular to the emitter unit orientation, such as shown in the embodiments of FIGS. 2 to 5, and if the array of capillary tubes is situated close to the emitter unit, the use of an insulating material as an array material may be advantageous in preventing arcing. In other embodiments of the present invention, the array of capillary tubes is held at a potential similar to the emitter unit in order to prevent arcing.

Typically, it is possible to arrange a plurality of arrays of capillary tubes in the charged particle beam device. These arrays of the plurality of arrays may have a plate structure. Also, the arrays of capillary tubes may be positioned so that they inclined to each another.

Typically, the capillary tubes 15 have a constant inner cross section diameter D along the longitudinal axis. Changes are typically within 1-2%. The thickness of the capillary tube walls is small enough to provide an open area fraction of typically 50%. The open area fraction is defined as the sum of the inner cross section areas of all capillary tubes at their outlet divided by the total area of the array of capillary tubes at their outlet. In other words, the open fraction area of an array of capillary tubes is defined as the ratio of the open area of the array to the area that is closed due to the walls of the capillary tubes. Typically the tubes 15 are oriented in parallel to each other with deviations in the range of 0.5 degrees. However, it is also possible to have them aligned to each other at some well defined angle to improve the aiming accuracy of the tubes to the emitter unit tip. In order to achieve a small desired inner cross section area of the capillary tubes, tubes of a given larger cross section area are bundled, heated and stretched. The stretching causes the tubes to decrease their diameters. The bundling, heating and stretching cycle may be repeated several times until the tubes reach the desired diameters. When the tubes have a desired tube diameter, the array of capillary tubes is cut into equal slices to obtain several bundles of tubes of a desired bundle length. The bundles of capillary tubes are then glued together in parallel to obtain an array of capillary tubes with a given number of tubes. This method allows the arrays of capillary tubes to be fabricated with an open area fraction of typically 50%.

Arrays of capillary tubes having a plate structure such as the embodiment shown in FIG. 9 typically consist of silicon through which holes or pores of a given diameter are etched which form the capillary tubes. In this case, the length L of the capillary tubes is defined by the thickness of the silicon wafer from which the tube plate is taken. The wafers can be as thick as several hundred micrometers. The diameter of the capillary tubes D is defined by the etching parameters that generate the holes. The etching of holes in silicon is described, e.g. in the U.S. Pat. No. 5,139,624. U.S. Pat. No. 5,139,624 discloses an electrolytic etching of silicon which allows the pores to be etched through the wafer with pore diameters that can be chosen to be in the range between 20 angstroms to several micrometers.

The invention claimed is:

1. A charged particle beam device for irradiating a specimen with ions comprising a gas field ion source unit for generating a beam of ions, the gas field ion source unit having
   an emitter unit having an emitter unit tip; and
   a gas supply system for directing gas to the emitter unit tip;
   wherein the gas supply system comprises an array of capillary tubes.

2. The charged particle beam device according to claim 1, further comprising an extractor unit for extracting ions from the emitter unit tip.

3. The charged particle beam device according to claim 1, wherein the array of capillary tubes comprises at least 100,000 tubes.

4. The charged particle beam device according to claim 1, wherein the capillary tubes of the array of capillary tubes are oriented essentially parallel to each other.

5. The charged particle beam device according to claim 1, wherein the capillary tubes of the array of capillary tubes are inclined to each other.

6. The charged particle beam device according to claim 1, wherein the inclination angle of the outermost capillary tubes is at least 150.

7. The charged particle beam device according to claim 1, wherein the position of the array of capillary tubes is such that the emitter unit tip is essentially in the center of the gas flow.

8. The charged particle beam device according to claim 1, wherein the array of capillary tubes is made of an insulating material.

9. The charged particle beam device according to claim 1, wherein the length (L) of each capillary tube is larger than the diameter (D) of the capillary tube by more than 10 times.

10. The charged particle beam device according to claim 1, wherein the inner cross section area of the capillary tubes is smaller than 10 $\mu m^2$.

11. The charged particle beam device according to claim 1, further comprising a pump unit for drawing off the gas emitted by the array of capillary tubes.

12. The charged particle beam device according to claim 1, wherein the array of capillary tubes is made of a solid body provided with a multitude of capillary tubes in the form of channels.

13. The charged particle beam device according to claim 1, wherein the array of capillary tubes provides a hole for the emitter unit to protrude.

14. The charged particle beam device according to claim 1, further comprising at least one aperture.

15. The charged particle beam device according to claim 2, wherein the extractor unit is in the form of an aperture.

16. A method for irradiating a specimen with ions by operating a charged particle beam device having a gas field ion source, the method comprising:
    directing a gas flow to an emitter unit, wherein the gas flow has a gas beam aperture angle of 3° or less.

17. The method according to claim 16, wherein the gas flow is focused.

18. The method according to claim 16, wherein directing the gas flow to the emitter unit is performed by operating a gas supply system having an array of capillary tubes.

19. The method according to claim 18, wherein the pressure at an inlet of the capillary tubes is between 0.1 mbar and 10 mbar.

20. The method according to claim 16, wherein the gas flow comprises a gas from the group consisting of $N_2$, $H_2$, He, Ne, Ar, Kr, Xe, or $CH_4$.

* * * * *

UNITED STATES PATENT AND TRADEMARK OFFICE
CERTIFICATE OF CORRECTION

PATENT NO. : 7,692,165 B2
APPLICATION NO. : 11/752560
DATED : April 6, 2010
INVENTOR(S) : Winkler Page 1 of 1

It is certified that error appears in the above-identified patent and that said Letters Patent is hereby corrected as shown below:

In the Detailed Description of the Drawings:

Column 11, Line 3, please insert --The angle $\alpha$ can be further minimized if the capillary tubes are arranged so that they are inclined to each other. This is shown in Fig. 5a. In contrast with the embodiment shown in Fig. 4a, where the capillary tubes are arranged in parallel to each other, the capillary tubes shown in the embodiment of Fig. 5a are oriented vertically to a spherical shape (not shown) so that a focused stream of gas is created. This way of orienting the capillary tubes allows for gas aperture angles $\alpha$ having minus degrees, such as -5°, -10° or even -15°. That is, the gas stream leaving the outlet 20 of the capillary tubes 15 is focused on its way to the emitter unit tip 35. This is indicated by the dotted lines 40. In general, gas flows with aperture angles $\alpha$ below 0° stand for focused gas flows.-- before the paragraph beginning within;

In the Claims:

Column 15, Claim 6, Line 31, please delete "150" and insert --15°-- therefor.

Signed and Sealed this

Twenty-ninth Day of June, 2010

David J. Kappos
*Director of the United States Patent and Trademark Office*

UNITED STATES PATENT AND TRADEMARK OFFICE
CERTIFICATE OF CORRECTION

PATENT NO. : 7,692,165 B2  Page 1 of 1
APPLICATION NO. : 11/752560
DATED : April 6, 2010
INVENTOR(S) : Winkler It is certified that error appears in the above-identified patent and that said Letters Patent is hereby corrected as shown below:

In the Detailed Description of the Drawings:

Column 11, Line 3, please insert --The angle α can be further minimized if the capillary tubes are arranged so that they are inclined to each other. This is shown in Fig. 5a. In contrast with the embodiment shown in Fig. 4a, where the capillary tubes are arranged in parallel to each other, the capillary tubes shown in the embodiment of Fig. 5a are oriented vertically to a spherical shape (not shown) so that a focused stream of gas is created. This way of orienting the capillary tubes allows for gas aperture angles α having minus degrees, such as -5°, -10° or even -15°. That is, the gas stream leaving the outlet 20 of the capillary tubes 15 is focused on its way to the emitter unit tip 35. This is indicated by the dotted lines 40. In general, gas flows with aperture angles α below 0° stand for focused gas flows.-- before the paragraph beginning with In;

In the Claims:

Column 15, Claim 6, Line 31, please delete "150" and insert --15°-- therefor.

This certificate supersedes the Certificate of Correction issued June 29, 2010.

Signed and Sealed this

Twenty-third Day of November, 2010

David J. Kappos
*Director of the United States Patent and Trademark Office*